(12) United States Patent
Elkins et al.

(10) Patent No.: US 12,289,867 B2
(45) Date of Patent: Apr. 29, 2025

(54) ELECTRONIC EQUIPMENT CABINETS WITH CONFIGURABLE AIR PLENUMS

(71) Applicant: Vertiv Corporation, Columbus, OH (US)

(72) Inventors: Jin Harrison Elkins, Auburn, AL (US); Adarsh Khandelwal, Pune (IN)

(73) Assignee: VERTIV CORPORATION, Westerville, OH (US)

( * ) Notice: Subject to any disclaimer, the term of this patent is extended or adjusted under 35 U.S.C. 154(b) by 389 days.

(21) Appl. No.: 17/735,530

(22) Filed: May 3, 2022

(65) Prior Publication Data

US 2022/0361373 A1 Nov. 10, 2022

Related U.S. Application Data

(60) Provisional application No. 63/183,921, filed on May 4, 2021.

(30) Foreign Application Priority Data

Mar. 18, 2022 (IN) .............................. 202221015016

(51) Int. Cl.
  *H05K 7/20* (2006.01)
  *H05K 5/10* (2025.01)
(52) U.S. Cl.
  CPC .......... *H05K 7/20572* (2013.01); *H05K 5/10* (2025.01); *H05K 7/20145* (2013.01); *H05K 7/20172* (2013.01)

(58) Field of Classification Search
  CPC ............ H05K 7/20572; H05K 5/0004; H05K 7/20145; H05K 7/20172; H05K 7/20736; H05K 7/20181
  See application file for complete search history.

(56) References Cited

U.S. PATENT DOCUMENTS 3,120,166 A      2/1964  Lyman
4,739,444 A  *   4/1988  Zushi ................. H05K 7/20563
                                                             361/691
5,684,674 A  *  11/1997  Yin ...................... H05K 7/1429
                                                             361/825

(Continued)

*Primary Examiner* — Jorge A Pereiro
*Assistant Examiner* — Michael James Giordano
(74) *Attorney, Agent, or Firm* — HARNESS, DICKEY & PIERCE, P.L.C.

(57) ABSTRACT

An electronics equipment cabinet includes one or more cabinet walls defining an interior enclosure space for housing electronic equipment and an air management box coupled to an interior surface of one of the one or more cabinet walls. The air management box includes a wall and a plurality of plates detachably coupled to the wall. The plates include a first plate having one or more perforations defining a first perforation pattern and a second plate having one or more perforations defining a second perforation pattern to control the direction and/or volume of airflow to the electronic equipment in the interior enclosure space or from the electronic equipment in the interior enclosure space to the air management box. The first perforation pattern is different than the second perforation pattern. Other example electronics equipment cabinets, electronics equipment cabinet kits, and methods of controlling airflow in electronic equipment cabinets are also disclosed.

19 Claims, 7 Drawing Sheets

(56) References Cited

U.S. PATENT DOCUMENTS

| | | | |
|---|---|---|---|
| 6,272,012 B1* | 8/2001 | Medin | G06F 1/20 |
| | | | 361/679.48 |
| 6,506,111 B2 | 1/2003 | Sharp et al. | |
| 7,295,444 B1 | 11/2007 | Wang | |
| 7,898,799 B2 | 3/2011 | Doll | |
| 8,475,246 B2 | 7/2013 | Mayer et al. | |
| 8,517,054 B2 | 8/2013 | Lai et al. | |
| 10,212,851 B2 | 2/2019 | Rimler et al. | |
| 10,455,743 B2 | 10/2019 | Crawford | |
| 10,555,440 B2 | 2/2020 | Bailey et al. | |
| 10,757,831 B2 | 8/2020 | Adrian | |
| 2002/0149911 A1* | 10/2002 | Bishop | H05K 7/20836 |
| | | | 361/690 |
| 2005/0168945 A1 | 8/2005 | Coglitore | |
| 2005/0237716 A1* | 10/2005 | Chu | H05K 7/20736 |
| | | | 361/696 |
| 2008/0266789 A1* | 10/2008 | Hruby | H05K 7/20572 |
| | | | 361/692 |
| 2009/0059523 A1 | 3/2009 | Mallia et al. | |
| 2009/0061755 A1 | 3/2009 | Calder et al. | |
| 2009/0227197 A1 | 9/2009 | Lewis, II et al. | |
| 2010/0151781 A1 | 6/2010 | Slessman et al. | |
| 2012/0227930 A1* | 9/2012 | Rowe | H05K 7/206 |
| | | | 165/59 |
| 2013/0063888 A1 | 3/2013 | Wang | |
| 2013/0295834 A1 | 11/2013 | Faist et al. | |
| 2014/0148086 A1 | 5/2014 | Cash et al. | |
| 2017/0084516 A1* | 3/2017 | Harada | H02M 7/003 |
| 2020/0214177 A1 | 7/2020 | Chen et al. | |

* cited by examiner

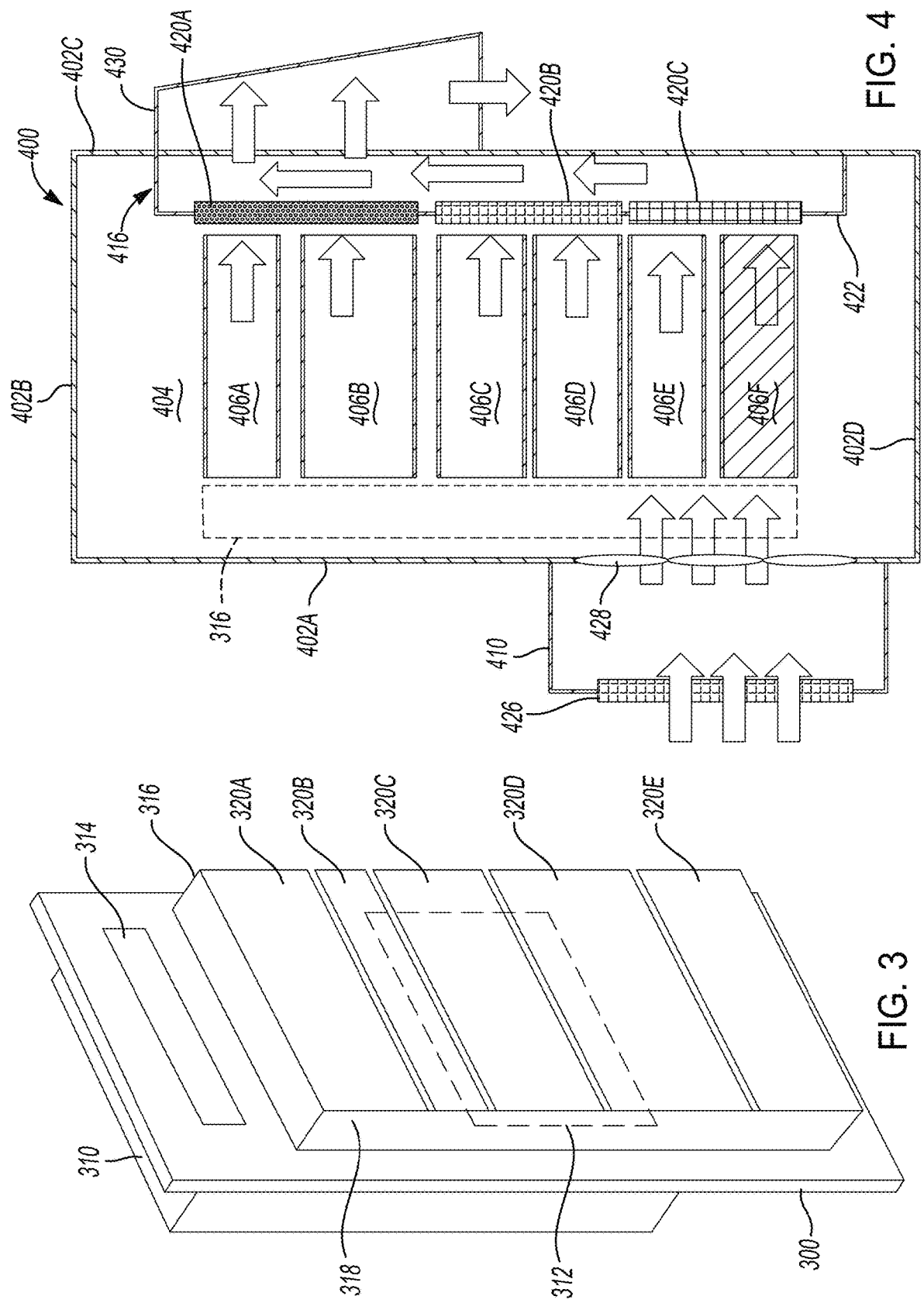

ELECTRONIC EQUIPMENT CABINETS WITH CONFIGURABLE AIR PLENUMS

CROSS-REFERENCE TO RELATED APPLICATIONS

This application claims the benefit of U.S. Provisional Application No. 63/183,921 filed May 4, 2021, and India Provisional Patent Application No. 202221015016 filed Mar. 18, 2022. The entire disclosures of the above applications are incorporated herein by reference.

FIELD

The present disclosure relates to electronic equipment cabinets with configurable air plenums.

BACKGROUND

This section provides background information related to the present disclosure which is not necessarily prior art.

Electronic equipment cabinets often house electronic devices. During operation, the devices generate heat and increase the temperature in the cabinet. Some cabinets are sealed to inhibit entry of debris, etc. from external ambient air, which could otherwise damage or impair operation of the devices inside the cabinets. The increased temperatures inside the cabinet may reduce performance of the devices, may damage the devices, etc. Some cabinets include a cooling system such as an HVAC unit having a heat exchanger and/or fans to reduce the temperature in the cabinet.

SUMMARY

This section provides a general summary of the disclosure, and is not a comprehensive disclosure of its full scope or all of its features.

According to one aspect of the present disclosure, an electronics equipment cabinet includes one or more cabinet walls defining an interior enclosure space for housing electronic equipment and an air management box coupled to an interior surface of one of the one or more cabinet walls. The air management box includes a wall and a plurality of plates detachably coupled to the wall. The plurality of plates include a first plate having one or more perforations defining a first perforation pattern and a second plate having one or more perforations defining a second perforation pattern to control a direction and/or volume of airflow to the electronic equipment in the interior enclosure space or from the electronic equipment in the interior enclosure space to the air management box. The first perforation pattern is different than the second perforation pattern.

According to another aspect of the present disclosure, an electronics equipment cabinet kit including one or more cabinet walls defining an interior enclosure space for housing electronic equipment, an air management box coupled to an interior surface of one of the one or more cabinet walls, the air management box including a wall, and a plurality of plates each configured to detachably couple to the wall of the air management box. The plurality of plates each include one or more perforations to control a direction and/or volume of airflow to the electronic equipment in the interior enclosure space or from the electronic equipment in the interior enclosure space to the air management box. The air management box provides or receives a first airflow configuration when a first set of the plurality of plates are coupled to the wall, and the air management box provides or receives a second airflow configuration different than the first airflow configuration when a second set of the plurality of plates are coupled to the wall.

According to yet another aspect of the present disclosure, a method of controlling airflow in an electronic equipment cabinet is disclosed. The method includes one or more cabinet walls defining an interior enclosure space for housing electronic equipment and an air management box coupled to an interior surface of one of the one or more cabinet walls. The air management box includes a wall and a first set of plates coupled to the wall. The first set of plates each include one or more perforations to control a direction and/or volume of airflow to the electronic equipment in the interior enclosure space or from the electronic equipment in the interior enclosure space to the air management box. The method includes removing at least a portion of the first set of plates from the wall of the air management box, and coupling a second set of plates each including one or more perforations to the wall of the air management box to adjust the direction and/or volume of airflow to the electronic equipment in the interior enclosure space or from the electronic equipment in the interior enclosure space to the air management box.

Further aspects and areas of applicability will become apparent from the description provided herein. It should be understood that various aspects and features of this disclosure may be implemented individually or in combination with one or more other aspects or features. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 3 is a sectional isometric view of a door for an electronic equipment cabinet with an air management box coupled to the door, according to yet another example embodiment of the present disclosure.

FIG. 4 is a sectional side view of an electronic equipment cabinet having a cooling system, a stack of electronic equipment, an exhaust system, and an air management box positioned between the electronic equipment and the exhaust system, another example embodiment of the present disclosure.

Corresponding reference numerals indicate corresponding features throughout the several views of the drawings.

DETAILED DESCRIPTION

Figure 2:
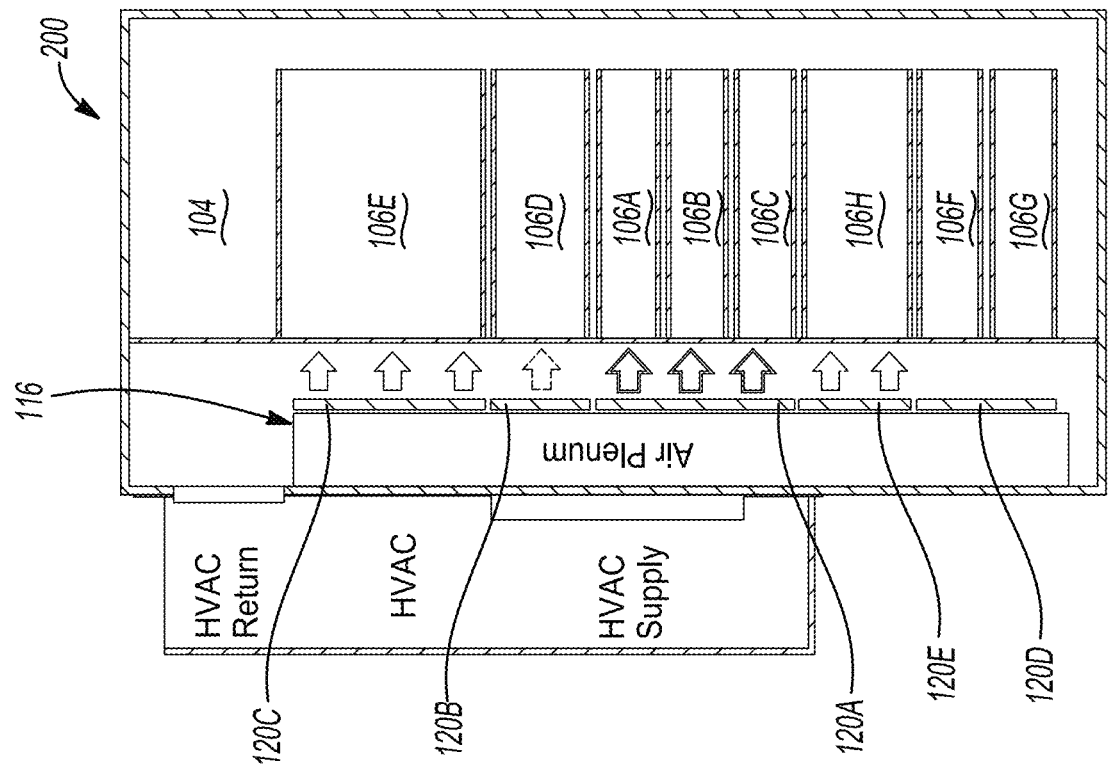
FIG. 2 is a sectional side view of an electronic equipment cabinet similar to the cabinet of FIG. 1, but with a reconfigured stack of electronic equipment and an air management box with reconfigured plates aligned with the electronic equipment, according to another example embodiment of the present disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Example embodiments will now be described more fully with reference to the accompanying drawings.

For example, methods for controlling airflow in an electronic equipment cabinet with a reconfigurable air management box are disclosed herein. In such examples, the electronic equipment cabinet may include one or more cabinet walls defining an interior enclosure space for housing electronic equipment and an air management box coupled to an interior surface of one of the cabinet wall(s). In some embodiments, the air management box includes a wall and a set of plates coupled to the wall. The plates each include one or more perforations to control a direction and/or volume of airflow to the electronic equipment in the interior enclosure space and/or from the electronic equipment in the interior enclosure space to the air management box. When desired, at least a portion of the set of plates may be removed (e.g., decoupled, detached, etc.) from the wall of the air management box, and another set of plates may be coupled to the wall of the air management box. In such examples, the newly coupled plates each include one or more perforations to adjust the direction and/or volume of airflow to the electronic equipment in the interior enclosure space and/or from the electronic equipment in the interior enclosure space to the air management box.

In such examples, at least a portion of the previously coupled plates (and/or other suitable air diverters) may be swapped out and/or re-arranged. For example, the newly coupled plates may include an entirely new set of plates different than the removed plates. In other examples, the newly coupled plates may include one or more of the removed plates and one or more new plates. In yet other examples, the newly coupled plates may be the same as the removed plates but re-arranged. In any case, the newly coupled plates (as a whole) and/or their arrangement are different than the previously coupled plates to change the direction and/or volume of airflow to the electronic equipment and/or from the electronic equipment.

The plates may be coupled to the wall of the air management box in a desired arrangement based on other components in the cabinet. For example, the plates may be arranged on the wall based on a stack of electronic equipment housed in the interior enclosure space of the cabinet. For instance, some plates may provide increased amounts of airflow as compared to other plates due to perforation(s) characteristics (e.g., the size, the amount, the location, etc. of perforations). In such examples, the plates providing increased airflow may be adjacent to electronic equipment that produce large amounts of heat (e.g., portions of high heat in the cabinet), and the plates providing less airflow may be adjacent to electronic equipment that generate less amounts of heat (e.g., portions of low heat in the cabinet). In some examples, the electronic equipment may be re-arranged and/or one or more pieces of electronic equipment may be replaced with new electronic equipment. This results in a change in the stack of electronic equipment. In such scenarios, at least a portion of the plates of the air management box may be swapped out and/or re-arranged based on the change in the stack, as further explained herein.

In some embodiments, one or more of the plates may be coupled to the wall of the air management box according to specific portions of the cabinet. For example, the interior enclosure space of the cabinet may include a first portion for housing one or more pieces of electronic equipment and a second portion for housing one or more other pieces of electronic equipment. In such examples, one or more plates (e.g., of the newly coupled plates, previously coupled plates, etc.) may be coupled to the wall to align with the first portion of the interior enclosure space, and one or more other plates (e.g., of the newly coupled plates, previously coupled plates, etc.) may be coupled to the wall to align with the second portion of the interior enclosure space, as further explained herein.

As explained above, the plates may be removed and/or coupled to the wall of the air management box. As such, the plates may detachably couple to the wall. In such cases, the plates may detachably couple to the wall by one or more mechanical devices, magnetic devices, etc. For example, one or more plates may be coupled to the wall via brackets, clips, rails, screws, bolts, etc. For instance, a plate may slide into and out of rails attached to the wall. In other examples, a plate may include a bracket and the wall may include a corresponding bracket for receiving the plate's bracket. In still other examples, a plate may be formed of a magnetic material and/or include a magnetic material on a surface for magnetically coupling the plate to the wall (e.g., a steel wall, etc.).

The air management box as used herein may be considered a plenum. For example, the air management box (e.g., the plenum) may be an air-filled space in the cabinet. In such examples, the air management box may only contain air (e.g., air entering and/or exiting the plenum). In other examples, the air management box may include some equipment (e.g., cables) but not electronic equipment.

The air management box may include at least one wall for defining an internal space. In some examples, the internal space may be defined only by wall(s) of the air management box. In such examples, the air management box may be formed separate from the cabinet and installed into the cabinet after formulation. In other example examples, the internal space may be defined by one or more walls of the air management box and one or more walls of the cabinet. In such examples, the air management box may be formed in the cabinet.

Additionally, the air management box may function in different manners. For example, the air management box may be a supply side box that receives cool air and then distributes the cool air to the electronic equipment in the interior enclosure space, as explained further below. In such examples, the air management box may be considered an air distribution box. In other examples, the air management box may be an exhaust side box that receives (e.g., collects) air heated by the electronic equipment and then passes the heated air to an exhaust system, as explained further below. In such examples, the air management box may be considered an air collection box.

The methods disclosed herein may be implemented with various electronic equipment cabinets including any one of the cabinets disclosed herein.

Figure 1:
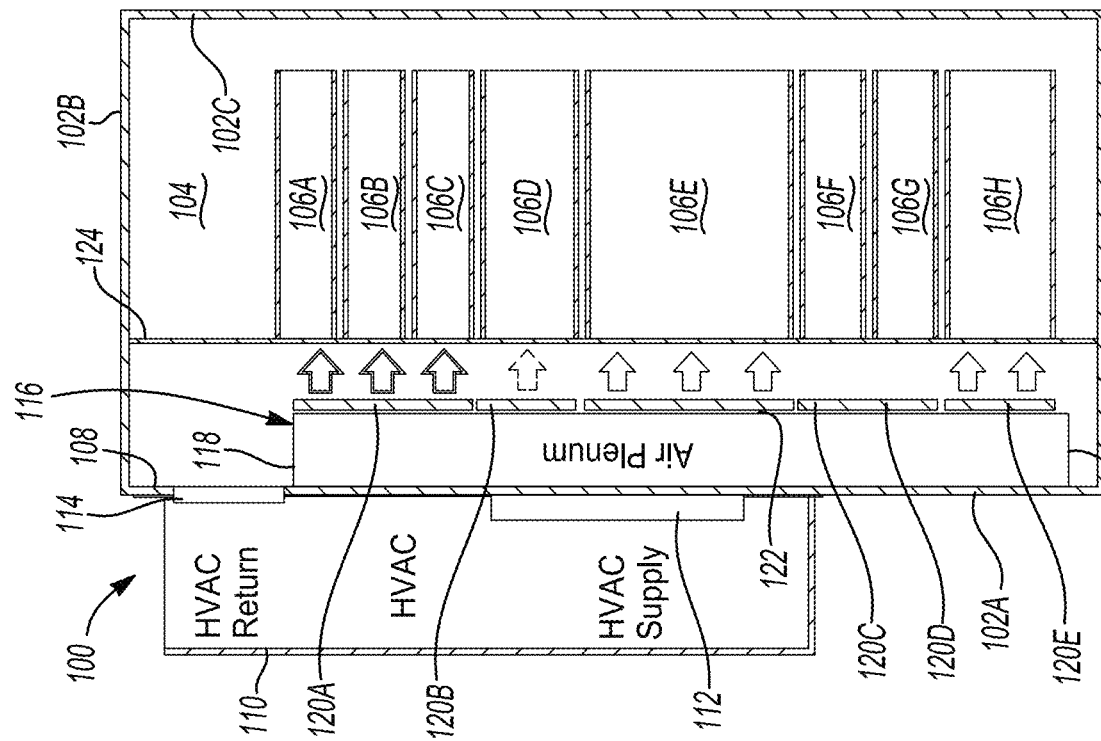
FIG. 1 is a sectional side view of an electronic equipment cabinet having a stack of electronic equipment and an air management box with plates for controlling airflow to the electronic equipment, according to one example embodiment of the present disclosure.

For example, an electronic equipment cabinet according to one example embodiment of the present disclosure is illustrated in FIG. 1 and indicated generally by reference number 100. As shown in FIG. 1, the cabinet 100 includes multiple cabinet walls 102A, 1028, 102C, 102D defining an interior enclosure space 104, electronic equipment in the interior enclosure space 104, and an air management box 116 (sometimes referred to as a plenum 116 herein) coupled to an interior surface 108 of the cabinet wall 102A. In the example of FIG. 1, the air management box 116 includes a wall 122 and multiple plates 120A, 1208, 120C, 120D, 120E detachably coupled to the wall 122. Although not shown in FIG. 1, the plates 120A, 1208, 120C, 120D, 120E may include one or more perforations to allow air to pass through. In some examples, the perforation(s) of one plate (e.g., the plate 120A) define a perforation pattern and the perforation(s) of another plate (e.g., the plate 120B) define a different perforation pattern. The perforation(s) and corresponding patterns may be used to control the direction and/or volume of airflow to the electronic equipment in the interior enclosure space 104, as further explained below.

In the example of FIG. 1, the electronic equipment includes multiple electronic devices 106A, 1068, 106C, 106D, 106E, 106F, 106G, 106H positioned within the interior enclosure space 104. The electronic devices 106A-106H may be positioned in any suitable location within the interior enclosure space 104. For example, the electronic devices 106A-106H may be vertically stacked (e.g., on one or more equipment racks 124) as shown in FIG. 1.

As shown in FIG. 1, the cabinet 100 may further include a cooling system 110 (e.g., an HVAC unit) coupled to the outer surface (e.g., an exterior side, etc.) of the cabinet wall 102A to provide cold air into the interior enclosure space 104 to cool the electronic devices 106A-106H. As shown, the cooling system 110 includes an air supply outlet 112 and an air return 114. In the example of FIG. 1, the wall 102A may define openings to correspond with the supply outlet 112 and the return 114 to permit air to flow into and out of the interior enclosure space 104.

The plenum 116 of FIG. 1 include sidewalls 118 extending generally perpendicular from the cabinet wall 102A and the wall 122 extending between the sidewalls 118. The sidewalls 118 and the wall 122 of the plenum 116 and the cabinet wall 102A define an interior (e.g., air-filed) space of the plenum 116.

The plenum 116 may be any suitable size and/or shape. For example, the plenum 116 may form a rectangular shape and extend from a lower portion of the cabinet 100 (e.g., below the supply outlet 112) to an upper portion of the cabinet 100 (e.g., above the supply outlet 112). Additionally, and as shown in FIG. 1, the overall height of the plenum 116 (e.g., the length of the wall 122 extending between the sidewalls 118) is generally equal to the collective height of the electronic devices 106A-106H included in the interior enclosure space 104. In other embodiments, the plenum 116 may form another suitable shape (e.g., a trapezoidal shape, etc.) depending on, for example, available space in the cabinet 100 and/or have another suitable height such as shorter or longer than the collective height of the electronic devices 106A-106H.

In the example of FIG. 1, the plenum 116 is a supply side box that receives air (e.g., cool air) and then distributes the air to the electronic equipment in the interior enclosure space 104. In particular, and as shown in FIG. 1, the plenum 116 (e.g., the air management box) is in fluid communication between the supply outlet 112 of the cooling system 110 and the electronic devices 106A-106H in the interior enclosure space 104. As such, the cooling system 110 pressurizes the plenum 116 with cold air via the supply outlet 112 and the perforations included in the plates 120A-120E of the plenum 116 control distribution of the air (e.g., the direction and/or volume of airflow) into the interior enclosure space 104. In such examples, the plenum 116 may be considered an air distribution box.

As explained above, the plenum 116 includes the plates 120A-120E. In such examples, the plates 120A-120E may be vertically-aligned, parallel to the cabinet wall 102, and detachably coupled to the wall 122 (e.g., covering openings in the wall 122). In some cases, the plates 120A-120E may form at least a portion of the wall 122 of the plenum 116 when they are coupled to the wall 122. The plates 120A-120E may detachably couple to the wall in any suitable manner such as with one or more mechanical devices, magnetic devices, etc. as explained herein.

Additionally, and as explained above, each of the plates 120A-120E includes perforations (e.g., openings) which permit air from the supply outlet 112 of the cooling system 110 to enter the interior enclosure space 104. In particular, pressurized cold air in the plenum 116 (and provided by the cooling system 110 in FIG. 1) may be distributed in a controlled manner with the perforations into the interior enclosure space 104. It should be appreciated that in some embodiments, one or more of the plates 120A-120E do not include openings (e.g., depending on the thermal requirements of the electronic devices included within the interior enclosure space 104, etc.). It should also be appreciated that in some embodiments, rather than being configured as plates having perforations, the configurable air diverters may include other structures to control the distribution of air into the interior enclosure space 104. For example, the configurable air diverters may be configured as dampers, louvers, fans, etc. to control the direction and/or volume of airflow to the equipment.

In the example of FIG. 1, each of the plates 120A-120E generally corresponds to one or more of the electronic devices 106A-106H. In some embodiments, one plate (e.g., the plate 120D) may be aligned with a single electronic device (e.g., 106D) or one plate (e.g., the plate 120A) may be aligned with multiple electronic devices (e.g., 106A-106C), etc. In such examples, the multiple electronic devices may include one general type of electronic device (e.g., electronic devices having the same or similar thermal requirements, etc.). For example, in FIG. 1, the electronic devices 106A-106C may have the same or similar thermal requirements and correspond to (e.g., are aligned with) the plate 120A, and the electronic devices 106F-106G may have the same or similar thermal requirements and correspond to (e.g., are aligned with) another the plate 120D. Further, in FIG. 1, the plate 120B is aligned with the electronic device 106D, the plate 120C is aligned with the electronic device 106E, and the plate 120E is aligned with electronic device 106H.

In some embodiments, the interior enclosure space 104 may include multiple portions each housing one or more electronic devices in the cabinet 100. For example, the interior enclosure space 104 may include a first portion for housing the electronic devices 106A-106C and a second portion for housing the electronic device 106D. In such examples, the plate 120A is positioned on the wall 122 to align with the first portion of the interior enclosure space 104 and the plate 120B is positioned on the wall 122 to align with the second portion of the interior enclosure space 104.

Additionally, in some embodiments, the density of the perforations (e.g., the amount of open area, etc.) on each plate 120A-120E may be dependent on the thermal requirements of the corresponding electronic device 106A-106H. In particular, the density of the perforations on each plate 120A-120E controls the amount of cold air that passes through the plates 120A-120E and is directed and/or delivered to each portion of the cabinet 100 to cool the electronic devices 106A-106H within that portion of the cabinet 100.

For example, the electronic devices 106A-106C may require greater cooling than the electronic device 106D. In this example, the plate 120A, which is horizontally aligned with electronic devices 106A-106C, may include a higher density of perforations than the plate 106B, which is horizontally aligned with the electronic device 106D. This enables a greater amount of cold air to be directed towards the electronic devices 106A-106C than towards the electronic device 106D. The density of perforations of each plate 106A-106E may be different to optimize the airflow directed at each of the electronic devices 106A-106H.

Additionally, in the example of FIG. 1, the size (e.g., height, etc.) of each plate 120A-120E generally corresponds to the size (e.g., height, etc.) of the electronic device or devices 106A-106H which correspond to the plate 120A-120E in the equipment stack. For example, a larger plate (e.g., the plate 120C) may be aligned with a larger electronic device (e.g., the electronic device 106E) and a smaller plate (e.g., the plate 120B) may be aligned with a smaller electronic device (e.g., the electronic device 106D).

By varying the open area (e.g., the density) of the perforation pattern and/or height of the plates 120A-120E, the airflow in the cabinet 100 can be optimized to eliminate hot spots in the stack of electronic devices 106A-106H in the interior enclosure space 104.

In some embodiments, one or more of the plates 120A-120E of the plenum 116 may be swapped out and/or re-arranged to accommodate different configurations of electronic devices in the cabinet 100. For example, FIG. 2 illustrates an electronic equipment cabinet 200 similar to the cabinet 100 of FIG. 1, but with the electronic devices 106A-106H in the interior enclosure space 104 arranged in a different configuration (e.g., stacked in a different order, etc.). In particular, in FIG. 1, the electronic devices 106A-106C are in a top position, the electronic device 106D is in an upper position, the electronic device 106E is in a middle position, the electronic devices 106F-106G are in a lower position, and the electronic device 106H is in a bottom position of the electronics stack. In contrast, in FIG. 2, the electronic device 106E is in the top position, the electronic device 106D is in the upper position, the electronic devices 106A-106C are positioned in the middle position, the electronic device 106H is in the lower position, and the electronic devices 106F-106G are in the bottom position.

To accommodate this re-arrangement of the electronic devices 106A-106H within the cabinet 200 and direct appropriate airflow to each position, the order of the plates 120A-120E of the plenum 116 is likewise rearranged to align the plates 120A-120E with their corresponding electronic devices 106A-106H. For example, the plates 120A-120E are detachably coupled to the plenum 116, such that the plates 120A-120E may be removed and re-mounted in a different arrangement, as explained herein. In doing so, the plenum 116 provides an airflow configuration to the electronic devices 106A-106H of FIG. 2 that is different than an airflow configuration provided to the electronic devices 106A-106H of FIG. 1.

In particular, in FIG. 1, the plate 120A is positioned in a top position on the plenum 116, the plate 120B is in an upper position, the plate 120C is in a middle position, the plate 120D is in a lower position and the plate 120E is in a bottom position. In contrast, in FIG. 2, the plate 120C is in the top position, the plate 120B is in the upper position, the plate 120A is positioned in the middle position, the plate 120E is in the lower position, and the plate 120D is in the bottom position. It should be appreciated that one or more of the plates may be replaced with one or more other plates, for example, having a different size and/or different density of perforations (e.g., as opposed to and/or in addition to the same plates being rearranged) depending on the configuration of electronic devices within the cabinet 200 of FIG. 2. In this way, the plenum 116 is configurable to accommodate a wide variety of arrangements and/or configurations of electronic devices within the cabinet 100.

In some embodiments, any one of the cabinet walls disclosed herein may be a door for accessing, for example, an interior enclosure space and electronic devices in the cabinet. For example, in some embodiments, the cabinet wall 102A of FIG. 1 is a door and the cooling system 110 and the plenum 116 are coupled to opposing sides of the door.

For example, FIG. 3 illustrates a door 300 for an electronic equipment cabinet (e.g., such as the cabinet 100, the cabinet 200, etc.). The door 300 partially defines an interior enclosure space of the cabinet. In the example of FIG. 3, the door 300 may be similar to the cabinet wall 102A of FIGS. 1 and 2.

As shown in FIG. 3, the cabinet includes a cooling system 310 (e.g., an HVAC unit) coupled to the outer surface (e.g., an exterior side, etc.) of the door 300 to provide cold air into the interior enclosure space to cool the electronic device(s) housed therein. The cooling system 310 includes a supply outlet 312 and a return 314 to permit air to flow into and out of the interior enclosure space of the cabinet.

Additionally, the cabinet further includes a plenum 316 (e.g., an air-distribution box, etc.) coupled to the inner surface (e.g., an interior side, etc.) of the door 300. The plenum 316 is in fluid communication with the supply outlet 312 of the cooling system 310. The plenum 316 includes sidewalls 318 extending perpendicularly from the door 300 and multiple plates 320A, 320B, 320C, 320D, 320E (e.g., configurable air diverters) detachably coupled (e.g., mounted) to the sidewalls 318, as explained herein. The plates 320A-320E may be similar to the plates 120A-120E of FIGS. 1 and 2. For example, the plates 320A-320E are vertically-aligned, parallel to the door 300, and swapped out and/or re-arranged as desired. In the particular example of FIG. 3, the plates 320A-320E form one side of the plenum 316.

In the example of FIG. 3, the plenum 316 extends from a lower portion of the cabinet to an upper portion of the cabinet. For example, the overall height of the plenum 316 may be generally equal to the height of the electronic device(s) included in the interior enclosure space of the cabinet, as explained herein.

Additionally, each of the plates 320A-320E includes a pattern of perforations (e.g., openings) which permit air from the supply outlet 312 of the cooling system 310 to enter the interior enclosure space of the cabinet. In particular, the cooling system 310 pressurizes the plenum 316 with cold air via the supply outlet 312. The perforations included in the plates 320A-320E of the plenum 316 then control distribution of the air into the interior enclosure space of the cabinet, as explained herein. Further, in some embodiments, one or more of the plates 320A-320E do not include perforations (e.g., depending on the thermal requirements of the electronic device(s) included within the interior enclosure space of the cabinet, etc.). It should also be appreciated that in some embodiments, rather than being configured as plates having perforations, the configurable air diverters may include other structures to control the distribution of air into the interior enclosure space of the cabinet. For example, the configurable air diverters may be configured as dampers, louvers, fans, etc. to control the direction and/or volume of airflow to the equipment.

Further, each of the plates 320A-320E generally corresponds to one of the electronic device(s) or one type of electronic device (e.g., electronic devices having the same or similar thermal requirements, etc.) that may be included in the cabinet. The density of the perforations (e.g., the amount of open area, etc.) on each plate 320A-320E may be dependent on the thermal requirements of the corresponding electronic device(s). In particular, the density of the perforations on each plate 320A-320E controls the amount of cold air that passes through the plates 320A-320E and is directed or delivered to each portion of the cabinet to cool the electronic device(s) within that portion of the cabinet, as explained herein. Additionally, the size (e.g., height, etc.) of each plate 320A-320E may be varied based on the configuration of the electronic device(s) included in the cabinet. For example, the size (e.g., height, etc.) of each plate 320A-320E may generally correspond to the size (e.g., height, etc.) of the electronic device(s) included in the cabinet. By varying the density of the perforations and the height of the plates 320A-320E, the airflow in the cabinet can be optimized to eliminate hot spots in the stack of electronic device(s) in the interior enclosure space of the cabinet as explained herein.

Although the plenums of FIGS. 1-3 are positioned adjacent to a cooling system, it should be appreciated that a plenum may be positioned in another suitable location. For example, in some embodiments, a plenum may be positioned adjacent to an exhaust system in a cabinet. In such examples, the cabinet may include a single plenum near the exhaust system. Alternatively, the cabinet may include a plenum near a cooling system and another plenum near the exhaust system.

For example, FIG. 4 illustrates an electronic equipment cabinet 400 similar to the cabinet 100 of FIG. 1, but with a plenum positioned adjacent to an exhaust system in the cabinet. Specifically, the cabinet 400 of FIG. 4 includes multiple cabinet walls 402A, 402B, 402C, 402D defining an interior enclosure space 404, electronic equipment (e.g., electronic devices 406A, 406B, 406C, 406D, 406E, 406F) in the interior enclosure space 404, an air management box 416 (sometimes referred to as a plenum 416 herein) coupled to an interior surface of the cabinet wall 402C, and an exhaust system 430 positioned near the top of the cabinet 400. In the example of FIG. 1, the air management box 416 includes a wall 422 and multiple plates 420A, 420B, 420C detachably coupled to the wall 422. Although not shown in FIG. 4, the plates 420A, 420B, 420C each may include one or more perforations to allow air to pass through. For example, the perforation(s) of one plate (e.g., the plate 420A) may define a perforation pattern and the perforation(s) of another plate (e.g., the plate 420B) may define a different perforation pattern. The perforation(s) and corresponding patterns may be used to control the direction and/or volume of airflow from the electronic devices 406A-406F in the interior enclosure space 404 to the air management box 416.

In the example of FIG. 4, the air management box 416 is positioned adjacent to the exhaust system 430 in the cabinet 400. In such examples, the air management box 416 may be an exhaust side box that receives (e.g., collects) air heated by the electronic equipment and then passes the heated air to the exhaust system 430. In such examples, the air management box 416 may be considered an air collection box.

As shown in FIG. 4, the exhaust system 430 (e.g., a shroud) includes an inlet and an outlet for removing air from the interior enclosure space 404. This movement of air in the exhaust system 430 is shown with arrows in FIG. 4. In such examples, the plenum 416 is in fluid communication between the electronic devices 406A-406F in the interior enclosure space 404 and the outlet of the exhaust system 430.

In the example of FIG. 4, the cabinet 400 may further include a cooling system 410 (e.g., an HVAC unit) coupled to the outer surface (e.g., an exterior side, etc.) of the cabinet wall 402A to provide cold air into the interior enclosure space 404 to cool the electronic devices 406A-406F. The plenum 316 may also be provided adjacent the cooling system, as noted earlier herein. As shown, the cooling system 410 is positioned near a bottom of the cabinet 400. In the example of FIG. 4, the cooling system 410 includes one or more filters 426 and one or more fans 428 for drawing air through the filters and into the interior enclosure space 404 via an air supply outlet.

The plates 420A-420C may be similar to the plates 120A-120E of FIG. 1. For example, the plates 420A-420C may have different densities of perforations dependent on the thermal requirements of the electronic device 406A-406F for controlling (and optimizing) the amount and direction of air that passes through the plates 420A-420C and into the plenum 416. Additionally, the plates 420A-420C may be positioned (e.g., aligned) and/or sized to generally correspond to location and/or size of one or more of the electronic device 406A-406F. For example, in FIG. 4, the height of the plate 420A generally corresponds to the collectively height of the electronic devices 406A, 406B, the height of the plate 420B generally corresponds to the collectively height of the electronic devices 406C, 406D, etc. Further, one or more of the plates 420A-420C of the plenum 416 may be swapped out and/or re-arranged to accommodate different configurations of electronic devices in the cabinet 400. By varying the open area (e.g., the density) of the perforation pattern, the height of the plates 420A-420C, the location of the plates 420-420C and/or which plates are employed, the airflow in the cabinet 400 can be optimized to eliminate hot spots in the stack of electronic devices 406A-406F in the interior enclosure space 404.

During operation, cool air is provided by the cooling system 410 to the interior enclosure space 404 to cool the electronic devices 406A-406F. The air is then heated by the electronic devices 406A-406F and enters the plenum 416 via the perforations in the plates 420A-420C. As such, air heated by the electronic devices 406A-406F is moved away from the devices and into the plenum space, where the hot air is exhausted from the cabinet 400 via the exhaust system 430. This minimizes the amount of hot air that may otherwise rise in the interior enclosure space 404 near the electronic devices 406A-406F in the stack.

As explained above, one or more of the plates 420A-420C of the plenum 416 in FIG. 4 may be swapped out and/or re-arranged to accommodate different configurations of electronic devices in the cabinet 400. In this way, the plenum 416 is configurable to accommodate a wide variety of arrangements and/or configurations of electronic devices within the cabinet 400.

Figure 6:
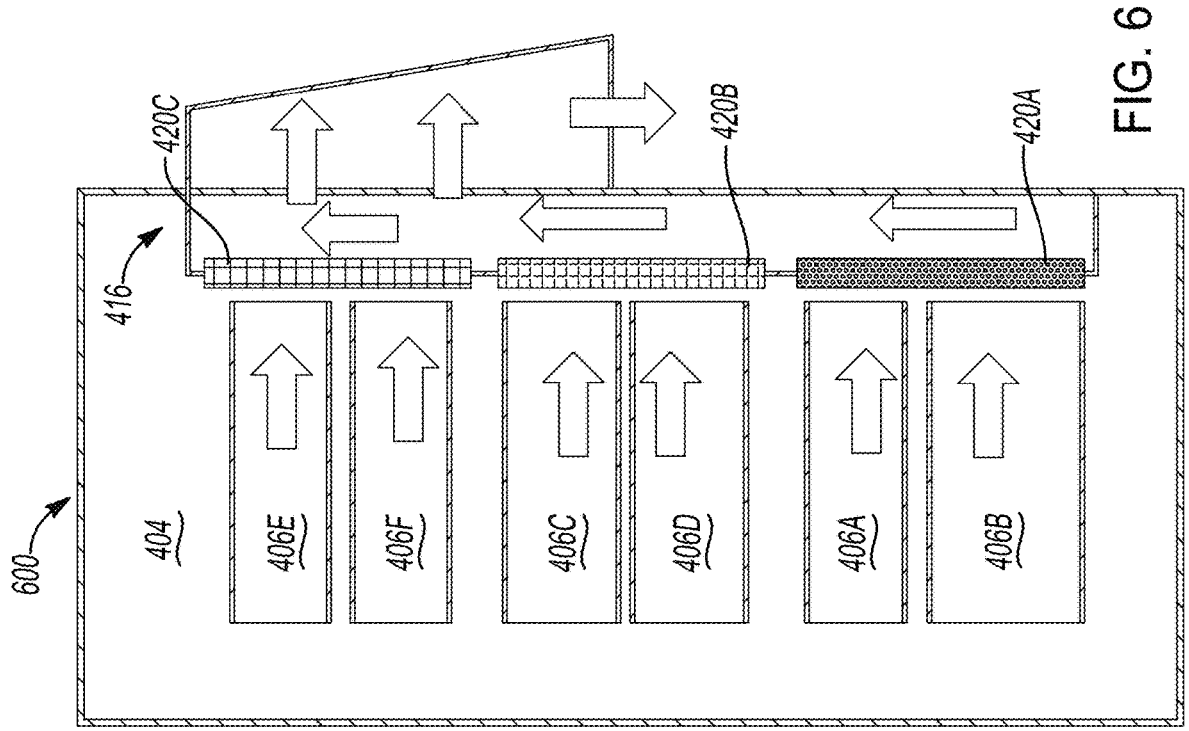
FIG. 6 is a sectional side view of an electronic equipment cabinet similar to the cabinet of FIG. 5, but with a reconfigured stack of electronic equipment and an air management box with reconfigured plates aligned with the electronic equipment, according to another example embodiment of the present disclosure.
Figure 5:
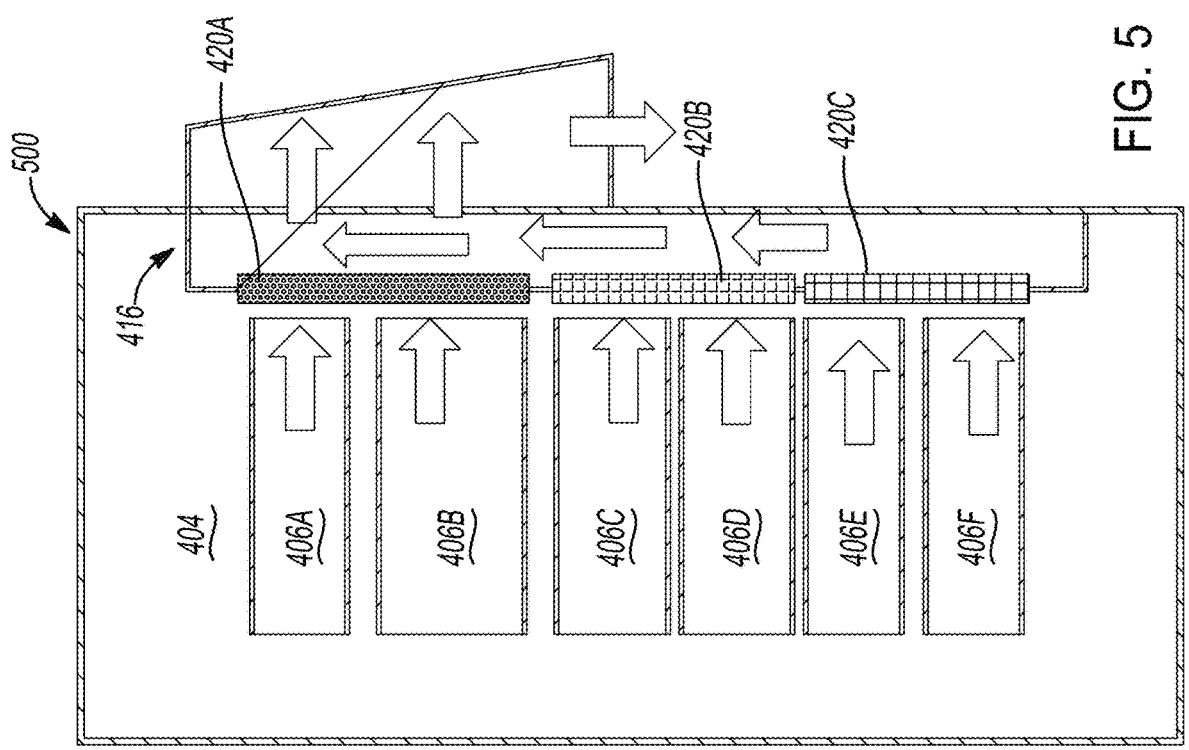
FIG. 5 is a sectional side view of an electronic equipment cabinet having a stack of electronic equipment, an exhaust system, and an air management box positioned between the electronic equipment and the exhaust system, yet another example embodiment of the present disclosure.

For example, FIGS. 5 and 6 illustrate electronic equipment cabinets 500, 600 similar to the cabinet 400 of FIG. 4, but without a cooling system. Specifically, the cabinet 500 of FIG. 5 includes the electronic devices 406A-406F of FIG. 4 in the interior enclosure space 404 arranged in a particular configuration (e.g., a stacked order), and the cabinet 600 of FIG. 6 includes the electronic devices 406A-406F of FIG. 4 in the interior enclosure space 404 arranged in a different configuration (e.g., a different stacked order). For example, in FIG. 5, the stacked order includes the electronic devices 406A, 406B in a top position, the electronic devices 406C, 406D in a middle position, and the electronic devices 406E, 406F in a bottom position. In FIG. 6, the stacked order includes the electronic devices 406E, 406F in the top position, the electronic devices 406C, 406D in the middle position, and the electronic devices 406A, 406B in the bottom position.

In connection therewith, the order of the detachable plates 420A-420C of the plenum 416 may be re-arranged based on the change in the stack. For example, one or more of the plates 420A-420C may removed from the plenum wall and re-mounted in to align with their corresponding electronic devices 406A-406F. For instance, in FIG. 5, the top plate 420A is aligned with the electronic devices 406A, 406B, the middle plate 420B is aligned with the electronic devices 406C, 406D, and the bottom plate 420C is aligned with the electronic devices 406E, 406F. When the electronic devices 406A, 406B, 406E, 406F are swapped (as shown in FIG. 6), the plates 420A, 420C may be swapped as well to align with their corresponding electronic devices. In doing so, an airflow configuration received by the plenum 416 in FIG. 6 is different than an airflow configuration received by the plenum 416 in FIG. 5.

Additionally, in some embodiments, one or more of the plates 420A-420C may be replaced with one or more other plates, for example, having a different size and/or density of perforations to optimize airflow and to change the airflow configuration received by the plenum 416. This replacement of plate(s) 420A-420C may depend on the configuration of the electronic devices 406A-406F, the removal of the electronic device(s) 406A-406F, and/or additional or replacement electronic devices added to the stack.

The detachable plates disclosed herein may include any suitable plate configuration. For example, the plates may include one or more perforations having different sizes, different shapes, uniform patterns, non-uniform patterns, etc. In other examples, some of the plates may not include perforations. Additionally, the plates may be the same size or different. In some examples, the plate sizes may vary depending on, for example, a standard U size of the electronic equipment. For example, one plate may be sized to correspond to one piece of electronic equipment having a standard rack size of 42 U (e.g., about 19 inches). In such examples, the plate may be about 19 inches in height. In other examples, one plate may be sized to correspond to two pieces of electronic equipment each having a standard rack size of 42 U. In such examples, the plate may be about 38 inches in height.

FIGS. 7-10 illustrate plates 700, 800, 900, 1000 of different sizes and having different perforation patterns. Each of the plates 700, 800, 900, 1000 may be employed in any one of the cabinets disclosed herein.

Figure 7:
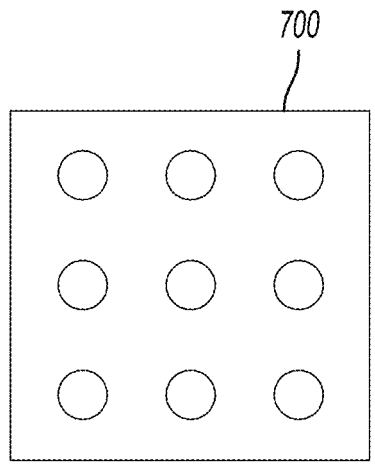
FIG. 7 is a front view of a plate employable in an electronic equipment cabinet, where the plate includes nine circular perforations according to yet another example embodiment of the present disclosure.
Figure 8:
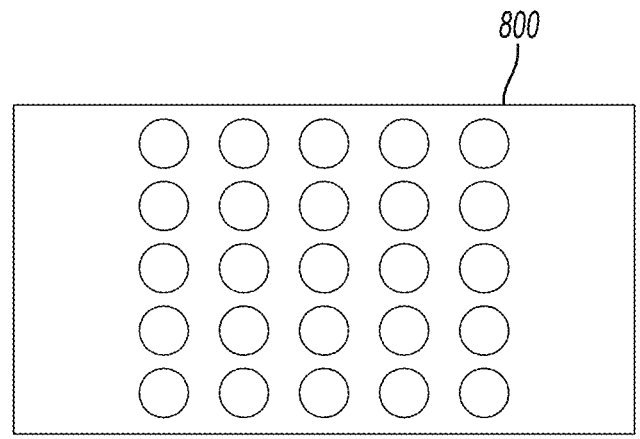
FIG. 8 is a front view of a plate employable in an electronic equipment cabinet, where the plate includes twenty-five circular perforations according to another example embodiment of the present disclosure.
Figure 9:
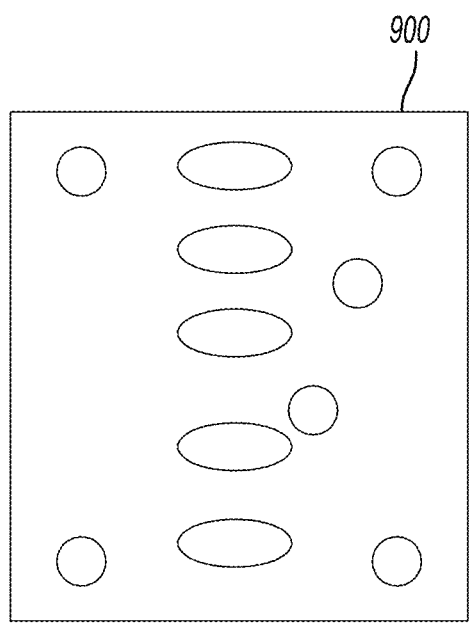
FIG. 9 is a front view of a plate employable in an electronic equipment cabinet, where the plate includes six circular perforations and five oval-shaped perforations according to yet another example embodiment of the present disclosure.
Figure 10:
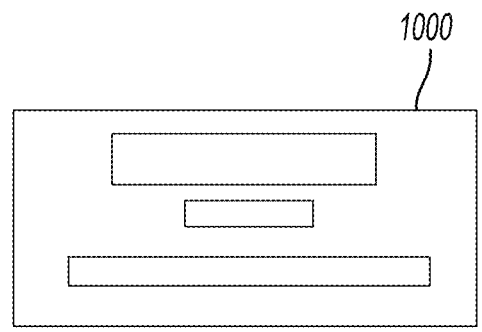
FIG. 10 is a front view of a plate employable in an electronic equipment cabinet, where the plate includes three rectangular perforations according to another example embodiment of the present disclosure.

For example, the plate 700 of FIG. 7 had a square shape and includes nine circular perforations. In the example of FIG. 7, the circular perforations are the same size and form a uniform pattern across the plate 700. In FIG. 8, the plate 800 is rectangular-shaped and includes twenty-five circular perforations. The perforations of FIG. 8 are the same size and form a uniform pattern across the plate 700. The plate 900 of FIG. 9 is rectangular-shaped, and includes six circular perforations and five oval-shaped perforations. In the example of FIG. 9, the circular perforations are the same size and form a non-uniform pattern across the plate 900. For example, two of the circular perforations are positioned on one side (e.g., the left side) of the plate 900 and four of the circular perforations are positioned on the other side (e.g., the right side) of the plate 900. Of the four circular perforations, two perforations (the top and bottom perforations) are aligned vertically and two perforations (the middle perforations) are offset by different distances. The five oval-shaped perforations are aligned vertically along the middle portion of the plate 900. The plate 1000 of FIG. 10 is rectangular-shaped and includes three rectangular perforations. In the example of FIG. 10, the rectangular perforations have different sizes.

Employing any one of the cabinets disclosed herein including a reconfigurable air plenum with detachable plates allows for improved thermal management and increased flexibility in thermal management as compared to conventional cabinets which commonly have large temperature gradients along a stack of equipment. The increased flexibility and improved thermal management may be achieved while minimizing redesign for changes in the cabinet such as rearranging existing electronic equipment in the cabinet, adding new electronic equipment to the cabinet, removing electronic equipment from the cabinet, etc. Thus, a single cabinet may have multiple configurations by rearranging, replacing, adding, removing, etc. one or more of the detachable plates to accommodate equipment changes in the cabinet while improving thermal management.

Figure 11:
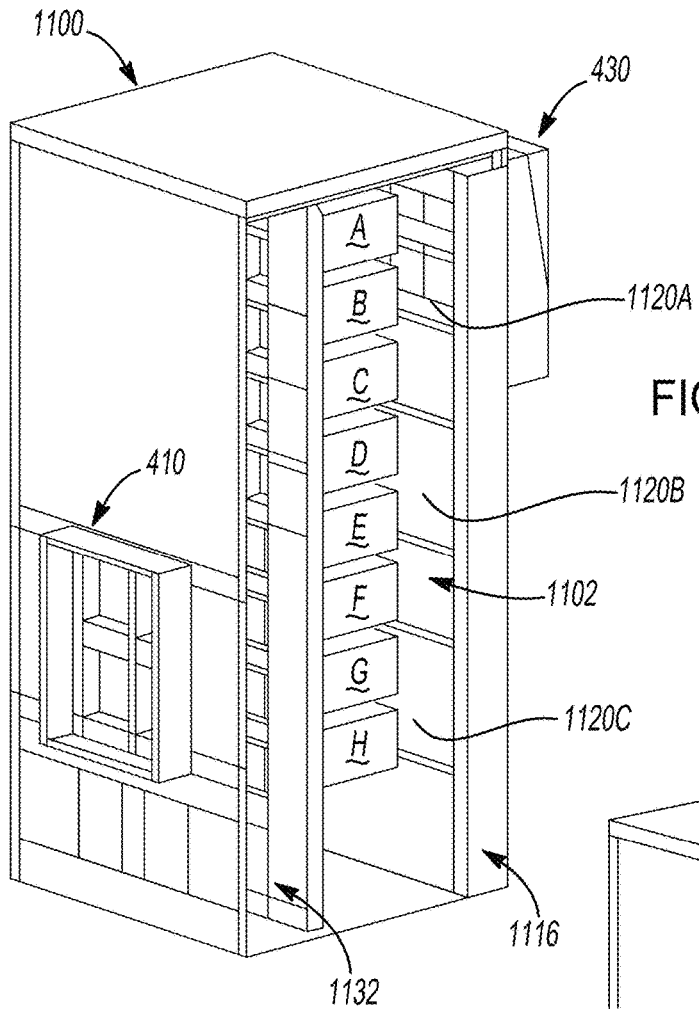
FIG. 11 is a sectional isometric view of an electronic equipment cabinet having a stack of electronic equipment, an exhaust system, and an air management box positioned between the electronic equipment and the exhaust system, according to yet another example embodiment of the present disclosure.
Figure 12:
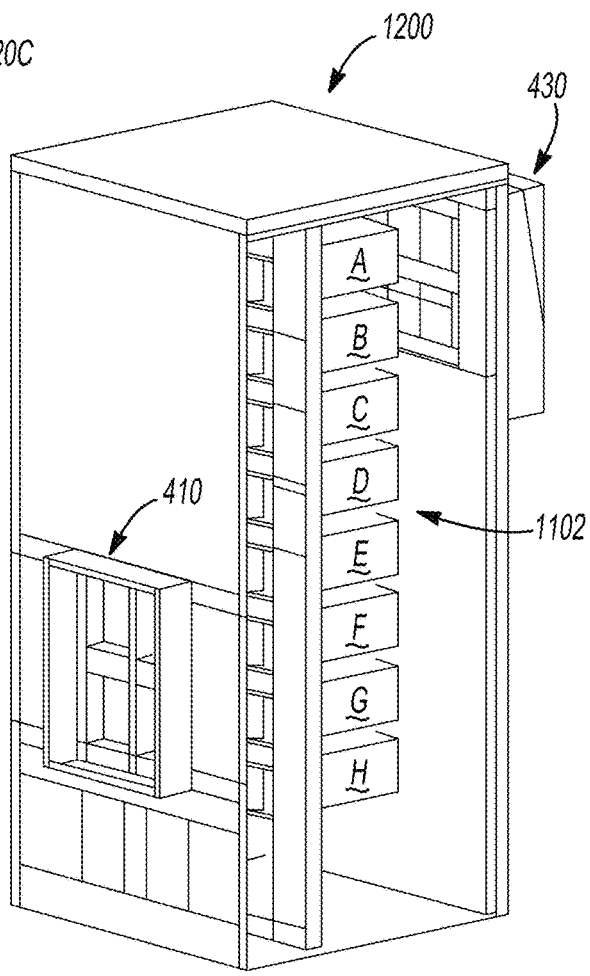
FIG. 12 is a sectional isometric view of a conventional electronic equipment cabinet having a stack of electronic equipment and an exhaust system.

For example, FIG. 11 illustrates an electronic equipment cabinet 1100 including a configurable air plenum as disclosed herein, and FIG. 12 illustrates a conventional electronic equipment cabinet 1200. Specifically, the cabinet 1100 of FIG. 11 is similar to the cabinet 400 of FIG. 4. For example, the cabinet 1100 includes the cooling system 410 and the exhaust system 430 of FIG. 4, a stack of electronics equipment 1102, and a plenum (e.g., an air management box) 1116. In some examples, the plenum 1116 may be similar to the plenum 416 of FIG. 4, etc. The stack of electronics equipment 1102 includes devices A-H. As shown in FIG. 11, the cooling system 410 and the exhaust system 430 are on opposing sides of the cabinet 1100, the cooling system 410 is located near the bottom of the cabinet 1100, and the exhaust system 430 is located near the top of the cabinet 1100. Further, the plenum 1116 is in fluid communication between the electronics equipment 1102 (e.g., the devices A-H) and the exhaust system 430.

Additionally, and as shown in FIG. 11, the plenum 1116 extends between a top and a bottom of the interior side of the cabinet 1100. Further, the plenum 1116 includes three detachable plates 1120A, 11208, 1120C. The plate 1120A includes one or more perforations forming a 50% open area (e.g., density), the plate 11208 includes one or more perforations forming a 70% open area, and the plate 1120C includes one or more perforations forming a 90% open area.

In some examples, the cabinet 1100 of FIG. 11 may include another (optional) plenum (e.g., an air management box). For instance, and as shown in FIG. 11, the cabinet 1100 may include a plenum 1132 is in fluid communication between the cooling system 410 and the electronics equipment 1102 (e.g., the devices A-H). In some embodiments, the plenum 1132 may be similar to the plenum 116 of FIGS. 1-2, etc. For instance, the plenum 1132 may include a wall and plates detachably coupled to the wall. In such examples, the plates may include one or more perforations having the same or different perforation pattern.

The cabinet 1200 of FIG. 12 includes the cooling system 410, the exhaust system 430, and the stack of electronics equipment 1102 of FIG. 11. In some embodiments, the electronic devices (e.g., the device F, G, H) located near and/or at the bottom of the stack may be high heat components. In such examples, air heated by these devices may rise and pass by the electronic devices before exhausting from the system 430 located near the top of the cabinet 1200. In doing so, the temperature around the devices increases and may adversely affect operation of the devices.

FIGS. 13-16 illustrate air temperature distribution and air velocity distribution testing in the cabinets 1100, 1200 of FIGS. 11-12, when a solar load is applied to a top and a side (e.g., near the exhaust system 430) of the cabinets 1100, 1200. In such examples, the cabinet 1100 may not include the optional plenum 1132 of FIG. 11. Additionally, the devices A, B have loads of 900 W, the devices C, D have loads of 1000 W, the devices E, F have loads of 1600 W, and the devices G, H have loads of 1800 W. As such, the total heat load from the devices A-H in this example is 10,600 W.

Figure 14:
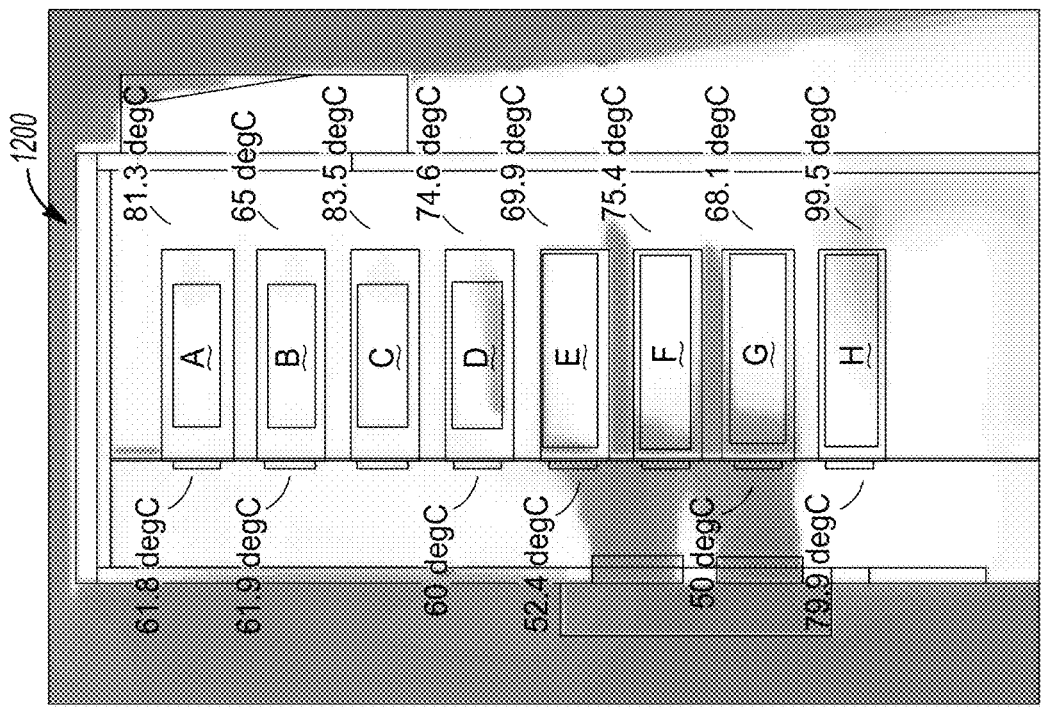
FIG. 14 is an air temperature distribution analysis of the electronic equipment cabinet of FIG. 12.
Figure 13:
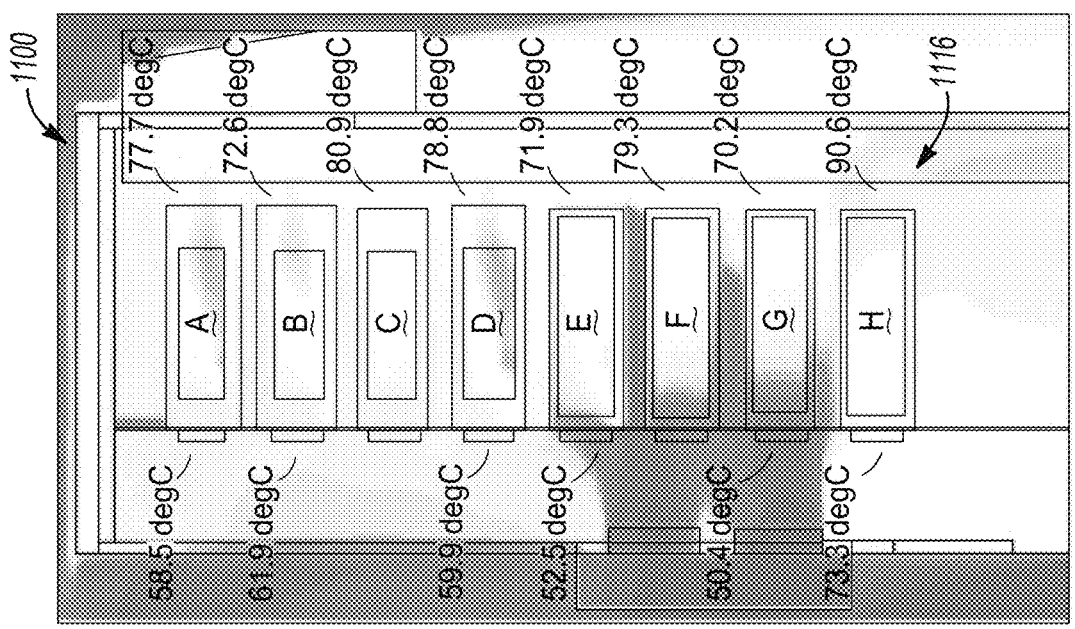
FIG. 13 is an air temperature distribution analysis of the electronic equipment cabinet of FIG. 11, according to another example embodiment of the present disclosure.

As shown in FIGS. 13-14, a temperature reduction of between about 3.5° C. and 4° C. is achieved in the cabinet 1100 (employing the reconfigurable plenum 1116) as compared to the cabinet 1200. For example, and as shown in FIG. 11, the sensed temperatures near the outlet side of the devices A, B, C, D, E, F, G, H are 77.7° C., 72.6° C., 80.9° C., 78.8° C., 71.9° C., 79.3° C., 70.2° C., and 90.6° C., respectively. Additionally, the sensed temperatures near the inlet side of the devices A, B, D, E, G, H of FIG. 11 are 58.5° C., 58.3° C., 59.9° C., 52.5° C., 50.4° C., and 73.3° C., respectively.

Conversely, the sensed temperatures in the cabinet 1200 are generally higher. For example, and as shown in FIG. 12, the sensed temperatures near the outlet side of the devices A, B, C, D, E, F, G, H are 81.3° C., 65° C., 83.5° C., 74.6° C., 69.9° C., 75.4° C., 68.1° C., and 99.5° C., respectively. Additionally, the sensed temperatures near the inlet side of the devices A, B, D, E, G, H of FIG. 12 are 61.8° C., 61.9° C., 60° C., 52.4° C., 50.6° C., and 79.9° C., respectively.

Figure 16:
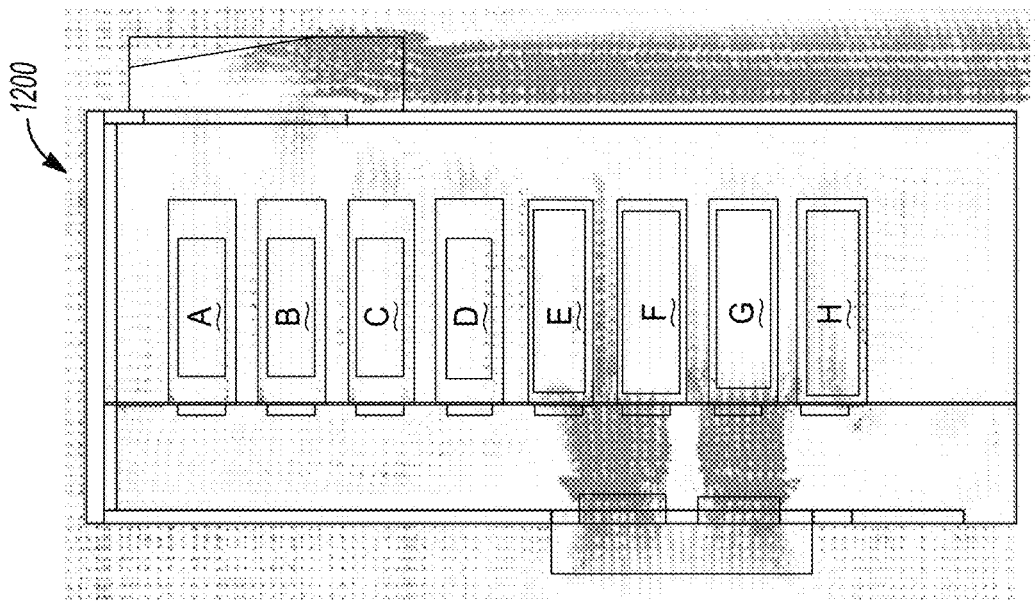
FIG. 16 is an air velocity distribution analysis of the electronic equipment cabinet of FIG. 12.
Figure 15:
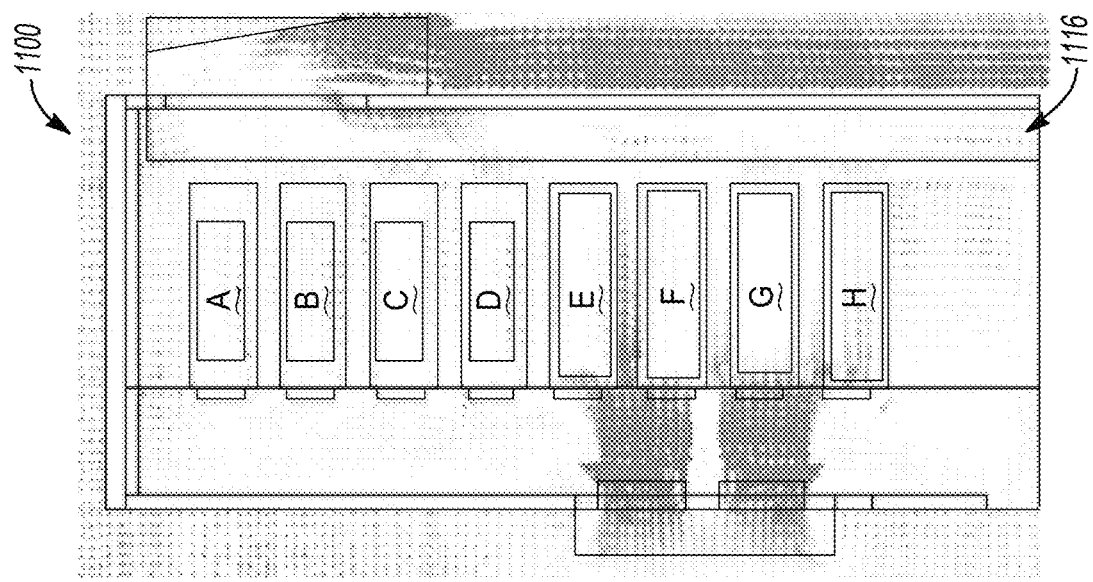
FIG. 15 is an air velocity distribution analysis of the electronic equipment cabinet of FIG. 11, according to yet another example embodiment of the present disclosure.

As shown in FIGS. 15-16, the air velocity distribution in the cabinets 1100, 1200 is substantially the same when a temperature reduction of between about 3.5° C. and 4° C. is achieved in the cabinet 1100 as compared to the cabinet 1200. For example, and as shown in FIGS. 15-16, the velocity of airflow entering and exiting the cabinets 1100, 1200 is about 4 m/sec, and the velocity of airflow between the devices A-H is lower (e.g., between about 0.8 m/sec and 2 m/sec in most cases).

The cabinets disclosed herein may be any suitable electronic equipment cabinet housing electronic equipment. For example, the cabinets may be deployed outdoors (e.g., an outdoor equipment cabinet, an outside plant (OSP) cabinet, etc.). In such examples, the cabinets may be rated for outdoor deployment, based on, for example, a temperature rating. In some examples, the cabinet walls (e.g., the walls 102A-102D of FIG. 1) may be coupled to one another to seal the interior enclosure space and inhibit external ambient air from entering the interior enclosure space. Further, the equipment included in the cabinets (e.g., electronic devices 106A-106H of FIG. 1) may be hardened (e.g., radiation-hardened, etc.) for deployment outdoors.

Additionally, the cabinets may include a cooling system as explained herein. For example, the cabinets may include an active cooling system such as an HVAC unit having one or more fans for drawing external ambient air into the HVAC unit to cool the air before entering the cabinets. In other embodiments, the cabinets may include a passive cooling system. In such examples, the cabinets may include a vent (e.g., openings, louvers, etc.) for allowing external ambient to enter the cabinets. In other embodiments, the cabinets may not include a cooling system.

The electronic equipment disclosed herein may include any suitable type of electronic devices. For example, the electronic devices may include power supply equipment (e.g., switched-mode power supplies, batteries, rectifiers, etc.), electronic communication (e.g., telecommunications) equipment (e.g., radios, antennas, transmitters, computers, servers, etc.), and controllers for controlling the power supply equipment, electronic communication equipment, etc.

Additionally, although the cabinets disclosed herein are described and shown with a specific number of plates and electronic devices, it should be appreciated that the cabinets may include any number of plates and/or electronic devices may be employed. For example, although FIG. 1 illustrates eight electronic devices 106A-106H positioned in the interior enclosure space 104, other embodiments may include more or less electronic devices. For example, the interior enclosure space 104 may house four electronic devices, five electronic devices, ten electronic devices, twelve electronic devices, etc. Additionally, although FIG. 1 illustrates the plenum 116 as including five plates 120A-120E, other embodiments may include more or less plates such as two plates, four plates, six plates eight plates, etc. In some examples, the number of plates employed in a cabinet may depend on, for example, the number, size, configuration, arrangement, etc. of electronic device(s) included within the cabinet.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. An electronics equipment cabinet comprising:
a plurality of cabinet walls defining an interior enclosure space for housing electronic equipment, a select one of the plurality of cabinet walls defining a first airflow opening acting as an air supply outlet, and a second airflow opening acting as an air return outlet elevationally above the air supply outlet;
an air management box coupled to an interior surface of the select one of the plurality of cabinet walls and forming a fully separate enclosure within the electronics equipment cabinet, the air management box further being mounted to overlay the air supply outlet, and further to be adjacent to at least one of a front area or a rear area of the electronics equipment cabinet, the air management box having a vertical footprint sufficient to cover all of the electronic equipment housed in the electronics equipment cabinet;
the air management box including a plurality of walls and a plurality of plates detachably coupled to the walls, at least one of the plurality of walls being a vertical wall that is secured directly to the select one of the plurality of cabinet walls over the airflow opening, and elevationally below the second airflow opening without obstructing the first airflow opening;
the plurality of plates including a first plate having one or more perforations defining a first perforation pattern and a second plate having one or more perforations defining a second perforation pattern to control a direction and/or volume of airflow to the electronic equipment in the interior enclosure space or from the electronic equipment in the interior enclosure space to the air management box, wherein the first perforation pattern is different than the second perforation pattern; and
wherein the first and second plates are removably supported in the air management box in a vertical orientation.

2. The electronics equipment cabinet of claim 1, wherein the interior enclosure space includes at least a first portion for housing a first electronic equipment and a second portion for housing a second electronic equipment, wherein the first plate is positioned on the plurality of walls to align with the first portion of the interior enclosure space, and wherein the second plate is positioned on the plurality of walls to align with the second portion of the interior enclosure space.

3. The electronics equipment cabinet of claim 1, wherein a density of the one or more perforations in the first perforation pattern is different than a density of the one or more perforations of the second perforation pattern.

4. The electronics equipment cabinet of claim 1, wherein the first plate is a different size than the second plate.

5. The electronics equipment cabinet of claim 1, wherein the first plate and the second plate are parallel to the plurality of cabinet walls.

6. The electronics equipment cabinet of claim 1, wherein the first plate and the second plate are vertically-aligned with one another.

7. The electronics equipment cabinet of claim 1, further comprising electronic equipment disposed in the interior enclosure space.

8. The electronics equipment cabinet of claim 1, further comprising a cooling system including a supply outlet for providing air into the interior enclosure space to cool the electronic equipment, wherein the air management box is in fluid communication between the supply outlet of the cooling system and the electronic equipment in the interior enclosure space.

9. The electronics equipment cabinet of claim 1, further comprising an exhaust system including the air return outlet for removing air from the interior enclosure space, wherein the air management box is in fluid communication between the electronic equipment in the interior enclosure space and the outlet of the exhaust system.

10. The electronics equipment cabinet of claim 1, wherein the air management box is a first air management box, wherein the electronics equipment cabinet further comprises a second air management box including a wall and a plurality of plates detachably coupled to the wall of the second air management box, a cooling system including a supply outlet for providing air into the interior enclosure space to cool the electronic equipment, and an exhaust system including an outlet for removing air from the interior enclosure space, wherein one of the first air management box and the second air management box is in fluid communication between the supply outlet of the cooling system and the electronic equipment in the interior enclosure space, and wherein the other one of the first air management box and the second air management box is in fluid communication between the electronic equipment in the interior enclosure space and the outlet of the exhaust system.

11. An electronics equipment cabinet kit comprising:
a plurality of cabinet walls defining an interior enclosure space for housing electronic equipment at a plurality of vertically spaced apart equipment locations within the electronic equipment cabinet, a select one of the plurality of cabinet walls defining a first airflow opening acting as an air supply outlet, and a second airflow opening acting as an air return outlet elevationally above the air supply outlet;
an air management box coupled to an interior surface of one of the cabinet walls, adjacent to one of a front area or a rear area of the electronics equipment cabinet and forming a fully separate enclosure within the electronics equipment cabinet;
the air management box including:
a plurality of walls, the air management box having a vertical footprint sufficient to cover all of the equipment locations, at least one of the plurality of walls being a vertical wall that is secured directly to the select one of the plurality of cabinet walls over the first airflow opening, and also to position the air management box elevationally below the second airflow opening, without obstructing the first airflow opening; and
a plurality of plates each configured to detachably couple to the walls of the air management box, the plurality of plates each including one or more perforations to control a direction and/or volume of airflow to the electronic equipment in the interior enclosure space or from the electronic equipment in the interior enclosure space to the air management box,
the air management box providing or receiving a first airflow configuration when a first set of the plurality of plates are coupled to the walls, and the air management box providing or receiving a second airflow configuration different than the first airflow configuration when a second set of the plurality of plates are coupled to the wall; and
wherein the first and second sets of plates are removably supported in the air management box in vertical orientations.

12. The electronics equipment cabinet kit of claim 11, wherein the first set of the plurality of plates includes a first plate and a second plate, wherein the interior enclosure space includes at least a first portion forming a first one of the equipment locations for housing a first electronic equipment, and a second portion forming a second one of the equipment locations for housing a second electronic equipment, wherein the first plate is positioned on the wall to align with the first portion of the interior enclosure space, and wherein the second plate is positioned on the wall to align with the second portion of the interior enclosure space.

13. The electronics equipment cabinet kit of claim 12, wherein a density of perforations of the first plate is different than a density of perforations of the second plate.

14. The electronics equipment cabinet kit of claim 13, wherein the first plate is a different size than the second plate.

15. The electronics equipment cabinet kit of claim 11, further comprising a cooling system including a supply outlet for providing air into the interior enclosure space to cool the electronic equipment, wherein the air management box is in fluid communication between the supply outlet of the cooling system and the electronic equipment in the interior enclosure space.

16. The electronics equipment cabinet kit of claim 11, further comprising an exhaust system including an outlet for removing air from the interior enclosure space, wherein the air management box is in fluid communication between the electronic equipment in the interior enclosure space and the outlet of the exhaust system.

17. A method of controlling airflow in an electronic equipment cabinet, including:
using a plurality of cabinet walls to define an interior enclosure space for housing electronic equipment;
coupling an air management box to an interior surface of one of the cabinet walls adjacent at least one of a front area or a rear area of the electronic equipment cabinet, the air management box having a vertical footprint sufficient to cover all of a plurality of vertically spaced equipment locations for the electronic equipment, and further including a plurality of walls, a select one of the plurality of walls defining a first airflow opening acting as an air supply outlet, and a second airflow opening acting as an air return outlet elevationally above the air supply outlet;
at least one of the plurality of walls being a vertical wall that is secured directly to the select one of the plurality of cabinet walls over the first airflow opening, and elevationally below the second airflow opening, without obstructing the first airflow opening;
coupling a first set of plates to at least one of the walls of the air management box, the first set of plates each including one or more perforations to control at least one of a direction or a volume of airflow to the electronic equipment in the interior enclosure space or from the electronic equipment in the interior enclosure space to the air management box, the method comprising:
removing at least a portion of the first set of plates from the wall of the air management box; and
coupling a second set of plates each including one or more perforations to the walls of the air management box to adjust at least one of the direction or the volume of airflow to the electronic equipment in the interior enclosure space or from the electronic equipment in the interior enclosure space to the air management box; and
wherein the first and second sets of plates are removably supported in the air management box in a vertical orientation.

18. The method of claim 17, further comprising changing a stack of the electronic equipment housed in the interior enclosure space, wherein coupling the second set of plates includes coupling the second set of plates based on the change in the stack.

19. The method of claim 17, wherein the interior enclosure space includes at least a first portion for housing a first electronic equipment and a second portion for housing a second electronic equipment, and wherein coupling the second set of plates includes coupling a first plate of the second set of plates to the wall to align with the first portion of the interior enclosure space and coupling a second plate of the second set of plates to the wall to align with the second portion of the interior enclosure space.

* * * * *